US009502560B2

(12) United States Patent
Zhu

(10) Patent No.: US 9,502,560 B2
(45) Date of Patent: Nov. 22, 2016

(54) SEMICONDUCTOR DEVICE AND METHOD OF MANUFACTURING THE SAME

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/797,762

(22) Filed: Jul. 13, 2015

(65) Prior Publication Data

US 2015/0318396 A1 Nov. 5, 2015

Related U.S. Application Data

(63) Continuation of application No. PCT/CN2013/071634, filed on Feb. 18, 2013.

(30) Foreign Application Priority Data

Jan. 15, 2013 (CN) .......................... 2013 1 0014872

(51) Int. Cl.
*H01L 29/78* (2006.01)
*H01L 29/66* (2006.01)
(Continued)

(52) U.S. Cl.
CPC ....... *H01L 29/7848* (2013.01); *H01L 21/0257* (2013.01); *H01L 21/02532* (2013.01); *H01L 21/26513* (2013.01); *H01L 21/3083* (2013.01); *H01L 21/31053* (2013.01); *H01L 21/31111* (2013.01); *H01L 29/0638* (2013.01); *H01L 29/1083* (2013.01); *H01L 29/165* (2013.01);
(Continued)

(58) Field of Classification Search
CPC .............. H01L 21/823431; H01L 21/823821; H01L 27/0886; H01L 27/0924; H01L 27/10826; H01L 27/1211; H01L 29/66537; H01L 21/845; H01L 27/10879; H01L 29/41791; H01L 29/66795; H01L 29/7831
USPC .............. 257/288, 368, 269, 263, 328, 369; 438/151, 197, 199, 137, 156, 192
See application file for complete search history.

(56) References Cited

U.S. PATENT DOCUMENTS

2002/0042172 A1\* 4/2002 Kuroda ............. H01L 21/76895
438/197
2007/0026615 A1 2/2007 Goktepeli et al.
(Continued)

FOREIGN PATENT DOCUMENTS

| CN | 1771589 A | 5/2006 |
|---|---|---|
| CN | 101924133 A | 12/2010 |
| CN | 101960572 A | 1/2011 |

*Primary Examiner* — Jarrett Stark
*Assistant Examiner* — Shahed Ahmed
(74) *Attorney, Agent, or Firm* — BainwoodHuang

(57) ABSTRACT

Provided are a semiconductor device and a method of manufacturing the same. An example device may include: a substrate having a well formed therein, the well including a first section and a second section, wherein the first section has a lower doping concentration and is closer to a surface of the substrate than the second section; a fin structure formed on the surface of the substrate; an isolation layer formed on the surface of the substrate, wherein the isolation layer exposes a portion of the fin structure, which serves as a fin for the semiconductor device; a gate stack formed on the isolation layer and intersecting the fin, wherein a Punch-Through Stopper (PTS) is formed in only a region directly under a portion of the fin where the fin intersects the gate stack.

6 Claims, 10 Drawing Sheets

(51) Int. Cl.
*H01L 29/06* (2006.01)
*H01L 29/10* (2006.01)
*H01L 21/265* (2006.01)
*H01L 21/311* (2006.01)
*H01L 21/3105* (2006.01)
*H01L 21/308* (2006.01)
*H01L 21/02* (2006.01)
*H01L 29/165* (2006.01)

(52) U.S. Cl.
CPC ..... *H01L 29/6681* (2013.01); *H01L 29/66545* (2013.01); *H01L 29/66795* (2013.01); *H01L 29/7851* (2013.01); *H01L 29/0673* (2013.01)

(56) References Cited

U.S. PATENT DOCUMENTS

| | | |
|---|---|---|
| 2007/0063224 A1 | 3/2007 | Watanabe et al. |
| 2008/0032469 A1 | 2/2008 | Oh et al. |
| 2009/0206405 A1 | 8/2009 | Doyle et al. |
| 2009/0267155 A1* | 10/2009 | Izumida ............ H01L 29/1054 257/365 |
| 2011/0237046 A1 | 9/2011 | Maszara et al. |
| 2013/0280883 A1* | 10/2013 | Faul ................ H01L 29/66803 438/434 |

* cited by examiner (a)

(b)

(a)

(b)

(a)

(b)

(a)

(b)

(a)

(b)

SEMICONDUCTOR DEVICE AND METHOD OF MANUFACTURING THE SAME

CROSS-REFERENCE TO RELATED APPLICATION

This application is a U.S. national phase application of PCT Application No. PCT/CN2013/071634, filed on Feb. 18, 2013, entitled "Semiconductor Device and Method of Manufacturing the Same," which claimed priority to Chinese Patent Application No. 201310014872.9, filed on Jan. 15, 2013. Both the PCT Application and the Chinese Application are incorporated herein by reference in their entireties.

TECHNICAL FIELD

The present disclosure relates to the semiconductor technology, and particularly to semiconductor devices and methods of manufacturing the same.

BACKGROUND

Short channel effects are getting more significant as planar semiconductor devices are increasingly scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin. In addition, an isolation layer is formed on the substrate to isolate the gate stack from the substrate. As such, the fin has its bottom surrounded by the isolation layer. Therefore, it is difficult for the gate to effectively control the bottom of the fin. As a result, a leakage current tends to occur between a source and a drain via the bottom of the fin.

Generally, a Punch-Through Stopper (PTS) can be used to suppress the leakage current. However, introduction of such a PTS increases band-to-band leakage, junction leakage, and junction capacitance.

SUMMARY OF THE DISCLOSURE

The present disclosure aims to provide, among others, a semiconductor device and a method of manufacturing the same.

According to an aspect of the present disclosure, there is provided a method of manufacturing a semiconductor device, comprising: forming, in a substrate, a well including a first section and a second section, wherein the first section has a lower doping concentration and is closer to a surface of the substrate than the second section; forming a fin structure on the surface of the substrate; forming an isolation layer on the surface of the substrate, wherein the isolation layer exposes a portion of the fin structure, which serves as a fin for the semiconductor device; forming, on the isolation layer, a sacrificial gate conductor layer which intersects the fin structure via a sacrificial gate dielectric layer; forming a gate spacer on sidewalls of the sacrificial gate conductor layer; forming a dielectric layer on the isolation layer, and planarizing the dielectric layer to expose the sacrificial gate conductor layer; selectively removing the sacrificial gate conductor layer to form a gate trench on inner sides of the gate spacer; forming a Punch-Through Stopper (PTS) under the fin through the gate trench; and forming a gate conductor in the gate trench.

According to another aspect of the present disclosure, there is provided a semiconductor device, comprising: a substrate having a well formed therein, the well including a first section and a second section, wherein the first section has a lower doping concentration and is closer to a surface of the substrate than the second section; a fin structure formed on the surface of the substrate; an isolation layer formed on the surface of the substrate, wherein the isolation layer exposes a portion of the fin structure, which serves as a fin for the semiconductor device; a gate stack formed on the isolation layer and intersecting the fin, wherein a Punch-Through Stopper (PTS) is formed in only a region directly under a portion of the fin where the fin intersects the gate stack According to embodiments of the present disclosure, the formed PTS is self-aligned to the under of the channel region, and thus it is possible to effectively reduce a leakage current between source and drain. Further, because the PTS is not present under the source and drain, it is possible to effectively reduce band-to-band leakage and junction leakage. In addition, due to the presence of the first section with the relatively lower doping concentration, it is possible to further reduce a junction capacitance between the source/drain and the well.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
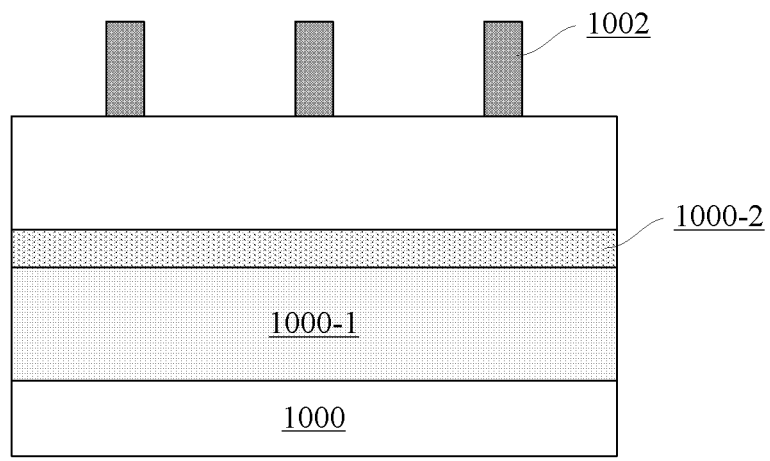
FIGS. 1 to 14 are schematic views showing a flow for manufacturing a semiconductor device according to an embodiment of the present disclosure.

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, there is provided a semiconductor device. The semiconductor device may comprise a substrate, a fin structure formed on the substrate, and a gate stack intersecting the fin structure. The gate stack may be isolated from the substrate by an isolation layer. The isolation layer may expose a portion of the fin structure. This exposed portion of the fin structure can serve as a real fin for the semiconductor device.

The semiconductor device may further comprise a well buried in the substrate. To reduce a junction capacitor between a source/drain region of the device and the well, the well may include a first section and a second section, wherein the first section has a lower doping concentration and is closer to a surface of the substrate than the second section. In this way, the source/drain region can adjoin the well through the first section with the relatively lower doping concentration.

To suppress leakage between the source and the drain via the bottom of the fin and also to reduce junction capacitance and junction leakage between the source/drain region and the substrate, the semiconductor device may comprise a Punch-Through Stopper (PTS) formed in only a region directly under a channel region. Such a PTS may be formed by the self-aligned technology disclosed herein.

According to an embodiment of the present disclosure, the self-aligned technology can be implemented together with the gate replacement technology. For example, the PTS may be formed by ion implantation through a gate trench (or hole) formed according to the gate replacement technology. Thus, the resultant PTS is directly under the gate trench (where the real gate stack is to be formed) and thus self-aligned to and directly under the channel region (a region where the fin intersects the gate stack for the device including the fin).

Specifically, a fin structure may be formed on a substrate (by, for example, patterning the substrate). Then, a sacrificial gate stack may be formed according to the replacement gate technology. For example, an isolation layer may be formed on the substrate to surround the bottom of the fin structure and expose the remaining portion of the fin structure (the exposed portion of the fin structure will serve as a real fin for the final device). The sacrificial gate stack is formed on the isolation layer. The sacrificial gate stack may comprise a sacrificial gate dielectric layer and a sacrificial gate conductor layer. A gate spacer may be formed on sidewalls of the sacrificial gate stack. Then, a dielectric layer may be formed on the isolation layer, and then planarized by, for example, Chemical Mechanical Polishing (CMP), to expose the sacrificial gate stack. After that, the sacrificial gate conductor layer may be selectively removed to form a gate trench (or hole) on inner sides of the gate spacer. A PTS may be formed through the gate trench (or hole) by, for example, ion implantation. Due to the presence of the dielectric layer, ions are implanted into substantially only a region directly under the gate trench (or hole).

According an embodiment of the present disclosure, the isolation layer may be formed by depositing a dielectric material on the substrate and then etching it back. Before the back-etching, the dielectric material may be planarized by sputtering, for example, sputtering with plasma such as Ar or N. A flatter surface can be achieved by such planarization through sputtering, instead of conventions CMP planarization.

According an embodiment of the present disclosure, the strained source/drain technology is also applicable. For example, after the sacrificial gate stack is formed, the fin structure may be selectively etched with the sacrificial gate stack as a mask. Then, a semiconductor layer may be epitaxially grown to form source and drain regions. Such source and drain regions can apply stress (compressive stress for a p-type device, or tensile stress for an n-type device) to the channel region, to improve device performances.

The present disclosure may be presented in various forms, and some examples thereof will be described hereafter.

As shown in FIG. 1, a substrate 1000 is provided. The substrate 1000 may comprise any suitable substrate in various forms, for example, but not limited to, bulk semiconductor substrate such as bulk Si substrate, Semiconductor On Insulator (SOI) substrate, compound semiconductor substrate such as SiGe substrate, or the like. In the following, a bulk Si substrate is described by way of example for convenience of description.

In some examples of the present disclosure, a well may be formed in the substrate 1000. For example, an n-type well may be formed for a p-type device, or a p-type well may be formed for an n-type device. For example, the n-type well may be formed by implanting n-type impurities such as P or As into the substrate 1000, and the p-type well may be formed by implanting p-type impurities such as B into the substrate 1000. If required, annealing may be performed after the implantation. To those skilled in the art, the n-type or p-type well may be formed in various ways, and detailed descriptions thereof will be omitted here.

To improve the device performances, the well may be formed to include two sections 1000-1 and 1000-2. The upper well section 1000-2 has a doping concentration (for example, lower than about $2E18$ $cm^{-3}$) than that of the lower well section 1000-1 (for example, higher than about $2E18$ $cm^{-3}$). Such a well may be formed as follows.

In an example, a first ion implantation may be performed. The first ion implantation may be performed into a region of the substrate corresponding to the entire well (including 1000-1 and 1000-2) (by, for example, controlling ion energy thereof). The first ion implantation may cause a relatively low doping concentration (which substantially determines the doping concentration of the section 1000-2). Next, a second ion implantation may be performed. The second ion implantation may be performed into a region of the substrate corresponding to the section 1000-1 whose doping concentration is relatively high (by, for example, controlling ion energy thereof). The second ion implantation has the same dopant type as the first ion implantation, so that the doping concentration in the region corresponding to the section 1000-1 is increased (and thus substantially determines the doping concentration of the section 1000-1).

In another example, a first ion implantation may be performed. The first ion implantation may be performed into a region of the substrate corresponding to the entire well (including 1000-1 and 1000-2) (by, for example, controlling ion energy thereof). The first ion implantation may cause a relatively high doping concentration (which substantially determines the doping concentration of the section 1000-1). Next, a second ion implantation may be performed. The second ion implantation may be performed into a region of the substrate corresponding to the section 1000-2 whose doping concentration is relatively low (by, for example, controlling ion energy thereof). The second ion implantation has an opposite dopant type to that of the first ion implantation, so that the doping concentration in the region corresponding to the section 1000-2 is decreased (and thus substantially determines the doping concentration of the section 1000-2).

Figure 2:
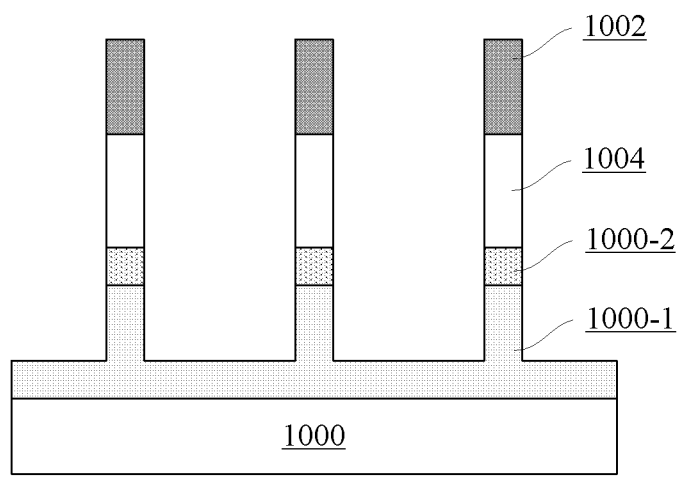

Next, the substrate 1000 may be patterned to form fin structures thereon. For example, this may be done as follows. Specifically, patterned photoresist 1002 may be formed on the substrate 1000 according to the design. The photoresist 1002 is typically patterned into a series of parallel, equally spaced lines. Subsequently, as shown in FIG. 2, the substrate 1000 may be etched by, e.g., Reactive Ion Etching (RIE), with the patterned photoresist 1002 as a mask, in order to form the fin structures 1004. Here, the etching of the substrate 1000 can be done into the well section 1000-1. Then, the photoresist 1002 may be removed.

It should be noted that the shape of trenches (between the fin structures 1004) formed by the etching is not necessarily a regular rectangle as shown in FIG. 2, but may be tapered from top down. Further, positions and the number of the fin structures formed are not limited to the example as shown in FIG. 2.

Furthermore, the fin structures are not limited to being formed by directly patterning the substrate. For example, the fin structures may be formed by epitaxially growing another semiconductor layer on the substrate and then patterning the other semiconductor layer. If there is sufficient etching selectivity between the other semiconductor layer and the substrate, the patterning of the fin structures may be stopped at the substrate, so as to implement a more precise control on the height of the fin structures.

Therefore, in the context of the present disclosure, the expression "forming a fin structure on (a surface of) a substrate" may comprise forming the fin structure on (the surface of) the substrate in any suitable manner.

A sacrificial gate stack intersecting the fin structures may be formed on the substrate according to the replacement gate process after the fin structures are formed by the above process.

Figure 3:
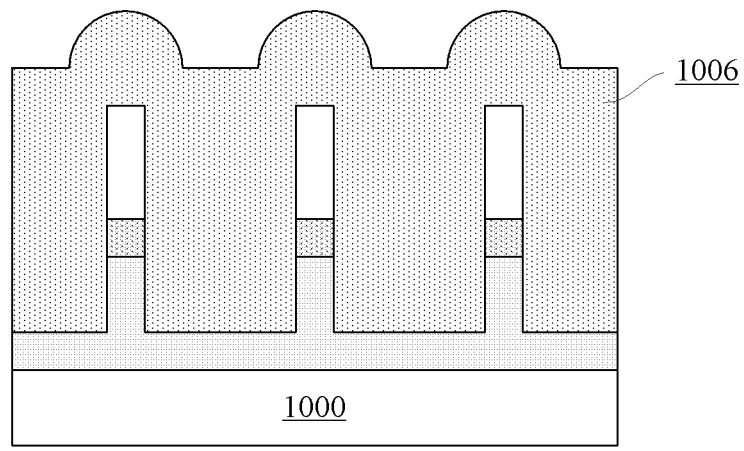

To isolate the gate stack from the substrate, an isolation layer may be formed on the substrate firstly. Specifically, as shown in FIG. 3, a dielectric layer 1006 may be formed on the substrate by e.g. deposition, so as to cover the formed fin structures 1004. For example, the dielectric layer 1006 may comprise oxide such as silicon oxide.

Figure 4:
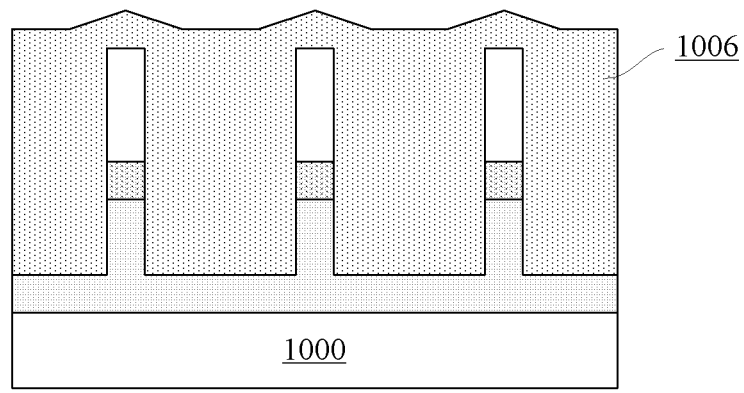

Subsequently, as shown in FIG. 4, the dielectric layer 1006 may be subjected to sputtering so as to be planarized. For example, plasma such as Ar or N plasma may be used for sputtering. Here, sputtering parameters, such as sputtering power and atmospheric pressure, may be controlled according to a cutting rate of the dielectric layer 1006 by the plasma sputtering, so as to determine a time period for the plasma sputtering. Thus, the plasma sputtering can be performed for a certain time period so as to sufficiently smooth a surface of the dielectric layer 1006. On the other hand, in the example as shown in FIG. 4, the plasma sputtering may be stopped before reaching the top surface of the fin structures 1004, so as to avoid excessive damage to the fin structures 1004.

Although FIG. 4 shows microscopic fluctuations, the top surface of the dielectric layer 1006 actually has a sufficient flatness, with fluctuations thereof controlled within, for example, several nanometers.

According to another embodiment of the present disclosure, the dielectric layer 1006 may be subjected to some CMP after planarization by sputtering, if necessary.

Figure 5:
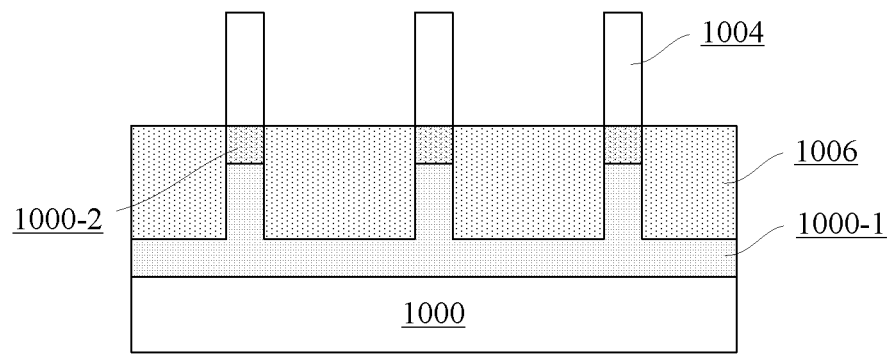

After the surface of the dielectric layer 1006 is sufficiently smoothed by the plasma sputtering, the dielectric layer 1006 may be etched back by e.g. RIE to expose a portion of the respective fin structures 1004, as shown in FIG. 5. The exposed portion may be subsequently used as a fin for a final device. The isolation layer may be constituted by the remaining dielectric layer 1006. Since the surface of the dielectric layer 1006 becomes smooth by sputtering before the back-etching, the surface of the isolation layer 1006 may keep substantially consistent across the substrate after the back-etching. In the case where the well is formed in the substrate 1000, the isolation layer 1006 preferably exposes the well slightly. That is, the isolation layer 1006 has its top surface slightly lower than that of the well section 1000-2 (a height difference thereof is not shown in the drawings). More specifically, the top surface of the isolation layer 1006 may be positioned between the top surface and the bottom surface of the well section 1000-2.

Next, a sacrificial gate stack intersecting the fins may be formed on the isolation layer 1006. For example, this may be done as follows.

Figure 6:
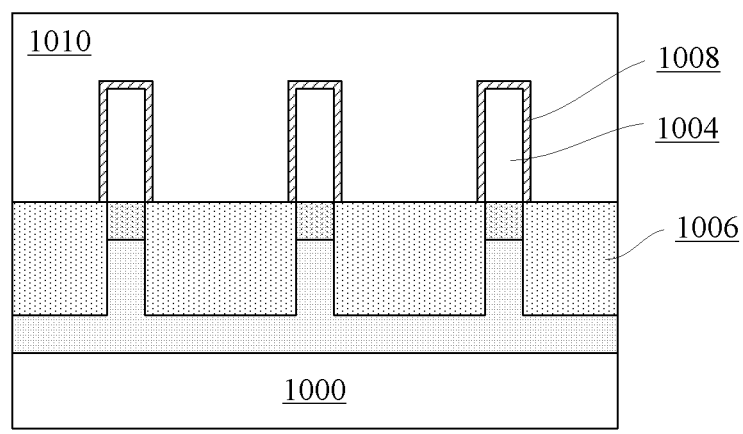

Specifically, as shown in FIG. 6, a sacrificial gate dielectric layer 1008 may be formed by e.g. deposition. For example, the sacrificial gate dielectric layer 1008 may comprise oxide with a thickness of about 0.8-1.5 nm. In the example as shown in FIG. 6, the sacrificial gate dielectric layer 1008 is shown in a "Π" shape. However, the sacrificial gate dielectric layer 1008 may also include a portion extending on the top surface of the isolation layer 1006. Then, a sacrificial gate conductor layer 1010 may be formed by e.g. deposition. For example, the sacrificial gate conductor layer 1010 may comprise polysilicon. The sacrificial gate conductor layer 1010 may fill the gaps between the fins, and then planarized by, for example, CMP.

Figure 7:
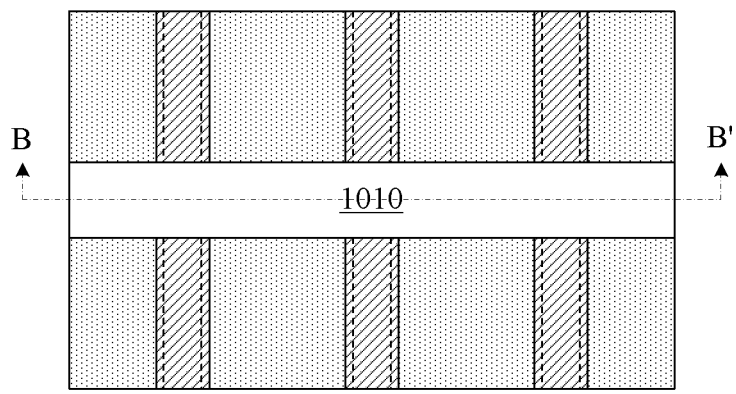
Figure 7:
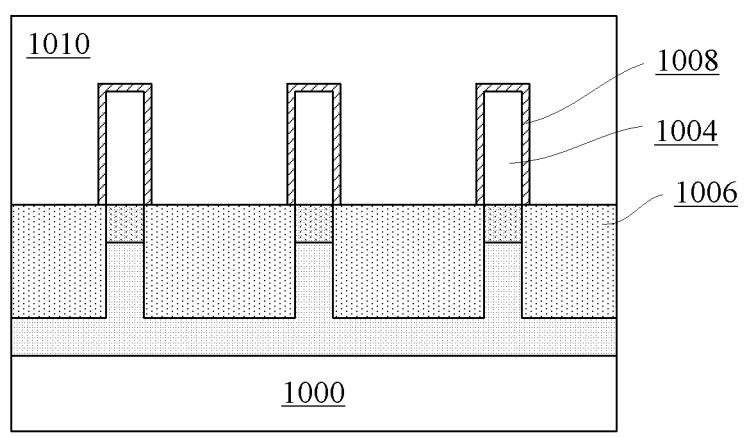

Next, as shown in FIG. 7 (FIG. 7(*b*) shows a cross-sectional view along line BB' in FIG. 7(*a*)), the sacrificial gate conductor layer 1010 may be patterned to define the sacrificial gate stack. In the example of FIG. 7, the sacrificial gate conductor layer 1010 is patterned into a bar intersecting the fin structures. According to another embodiment, the sacrificial gate dielectric layer 1008 may be further patterned with the patterned sacrificial gate conductor layer 1010 as a mask.

Figure 8:
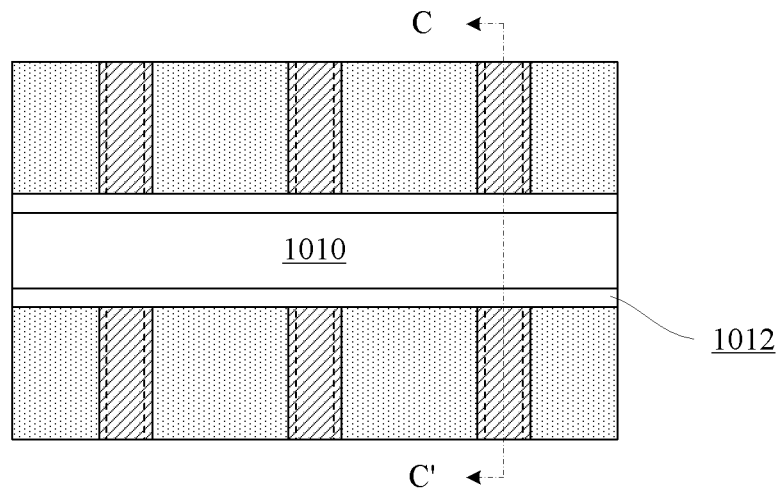
Figure 8:
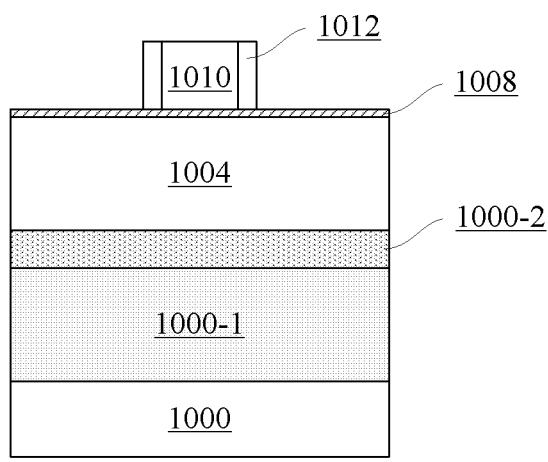

Next, as shown in FIG. 8 (FIG. 8(*b*) shows a cross-sectional view along line CC' in FIG. 8(*a*)), a gate spacer 1012 may be formed on sidewalls of the sacrificial gate conductor layer 1010. For example, nitride such as silicon nitride with a thickness of about 5-20 nm may be formed by deposition, and then subjected to RIE to form the gate spacer 1012. There are various methods to form the gate spacer, and detailed descriptions thereof are omitted here. When the trenches between the fin structures are tapered from top down (which is a common situation due to characteristics of etching), the spacer 1012 may have substantially no portion formed on sidewalls of the fin structures.

Figure 9:
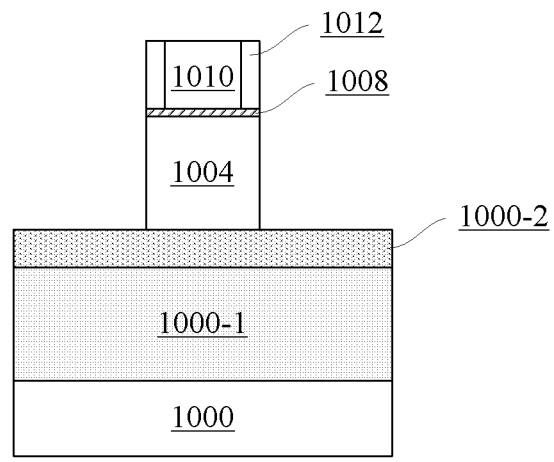

To improve the device performances, the strained source/drain technology can be applied according to an embodiment of the present disclosure. Specifically, as shown in FIG. 9, exposed portions of the sacrificial gate dielectric layer 1008 may be selectively removed (by e.g. RIE). In a case where both the sacrificial gate dielectric layer 1008 and the isolation layer 1006 comprise oxide, the RIE of the sacrificial gate dielectric layer 1008 may have substantially no impact on the isolation layer 1006 because the sacrificial gate dielectric layer 1008 is relatively thin. This operation is not required any more if the sacrificial gate dielectric layer has been further patterned with the sacrificial gate conductor as a mask in the process of forming the sacrificial gate stack as described above.

Next, portions of the fin structures 1004 which are exposed due to the removal of the sacrificial dielectric layer 1008 may be selectively removed (by e.g. RIE). The etching of those portions of the fin structures 1004 may be carried out to reach the well section 1000-2. Due to the presence of the sacrificial gate stack (the sacrificial gate dielectric layer and the sacrificial gate conductor) and the gate spacer, a portion of the fin structure 1004 may be left under the sacrificial gate stack. It is to be noted that the fin structure 1004 after being etched is shown in FIG. 9 to have its edges aligned with those of the gate spacer 1012, but the present disclosure is not limited thereto. For example, the edges of the fin structure 1004 may be recessed inward with respect to those of the gate spacer 1012 due to lateral effects (which might be small) of the etching.

Figure 10:
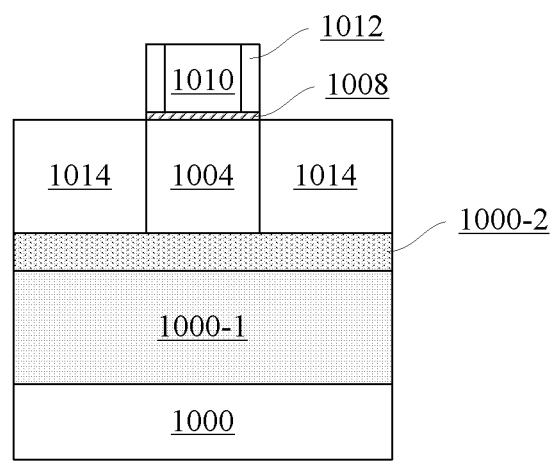

Subsequently, as shown in FIG. 10, a semiconductor layer 1014 may be formed on exposed portions of the fin structures by e.g. epitaxy. Then, source/drain regions may be formed in the semiconductor layer 1014. According to an embodiment of the present disclosure, the semiconductor layer 1014 may be doped in-situ while being grown. For example, n-type in-situ doping may be performed for an n-type device; while p-type in-situ doping may be performed for a p-type device. Moreover, in order to further improve the performances, the semiconductor layer 1014 may comprise a material different from that of the fin structure 1004 to apply stress to the fin structure 1004 (in which a channel of the device will be formed). For example, in a case where the fin structure 1004 comprises Si, the semiconductor layer 1014 may comprise Si:C (where an atomic percentage of C is e.g. about 0.2-2%) to apply tensile stress for the n-type device, or SiGe (where an atomic percentage of Ge is e.g. about 15-75%) to apply compressive stress for the p-type device.

Though the semiconductor layer 1014 is shown in the drawings in a fin-like shape corresponding to the fin structure 1004 (as shown by dotted lines in FIGS. 11(a), 12(a), and 14(a), for example), the present disclosure is not limited thereto. For example, the semiconductor layer 1004 may be extended laterally to some extent for convenience of making contacts to the source/drain regions.

In a case where the sacrificial gate conductor layer 1010 comprises polysilicon, the growth of the semiconductor layer 1014 may also occur on the top surface of the sacrificial gate conductor 1010. This is not shown in the drawings.

Though the strained source/drain technology is applied here, the present disclosure is not limited thereto. For example, the operations described in conjunction with FIGS. 9 and 10 may be omitted, with the fin structures 1004 not removed. In this case, source/drain implantation may be performed to form the source/drain regions.

Figure 11:
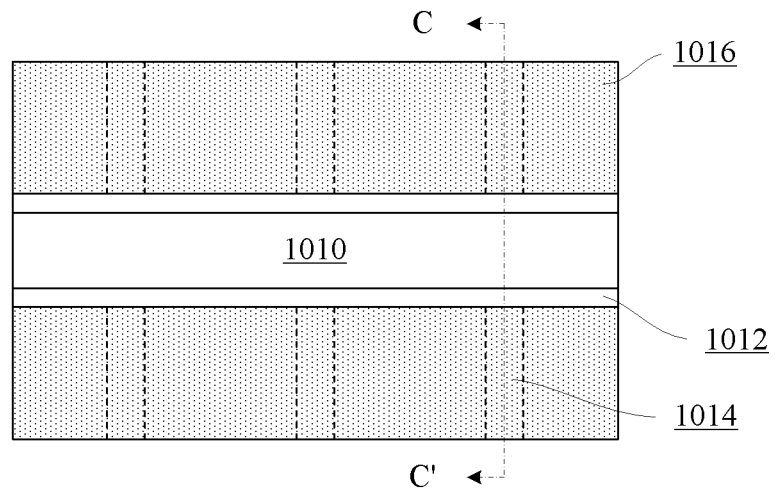
Figure 11:
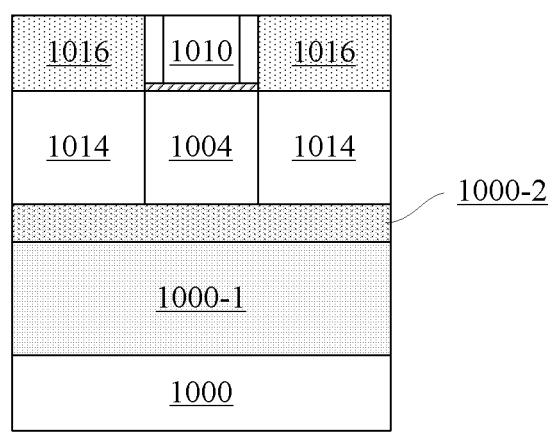

Next, as shown in FIG. 11 (FIG. 11(b) shows a cross-sectional view along line CC' of FIG. 11(a)), a further dielectric layer 1016 may be formed by e.g. deposition. The dielectric layer 1016 may comprise e.g. oxide. Subsequently, the dielectric layer 1016 may be planarized by e.g. CMP. The CMP may be stopped at the gate spacer 1012, so as to expose the sacrificial gate conductor layer 1010.

Figure 12:
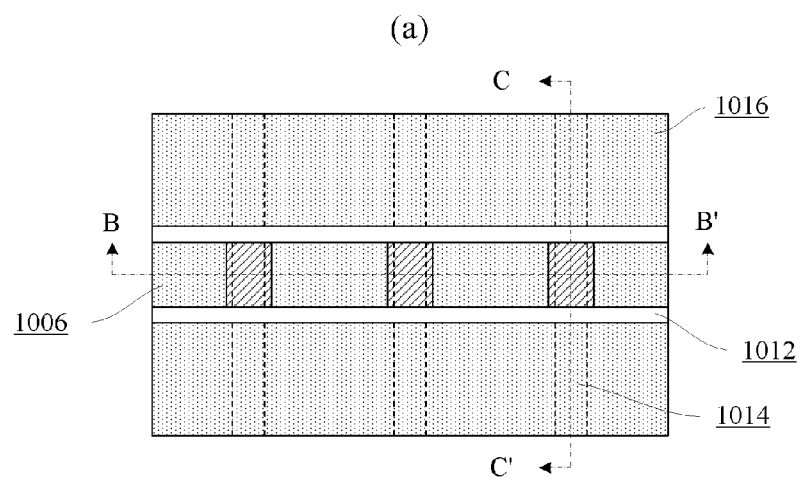
Figure 12:
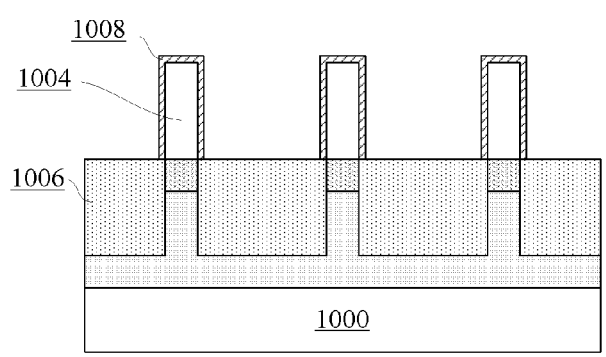
Figure 12:
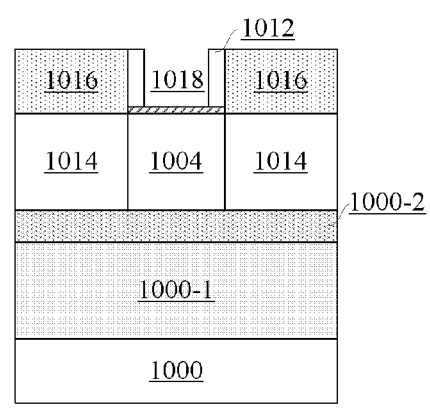

Then, as shown in FIG. 12 (FIG. 12(b) shows a cross-sectional view along line BB' of FIG. 12(a), and FIG. 12(c) shows a cross-sectional view along line CC' of FIG. 12(a)), the sacrificial gate conductor 1010 may be selectively removed by e.g. TMAH solution, so as to form a gate trench 1018 on inner sides of the gate spacer 1012. Here, the sacrificial gate dielectric layer 1008 is preferably not removed, to reduce damages to the fin structures 1004 in the subsequent ion implantation process.

Figure 13:
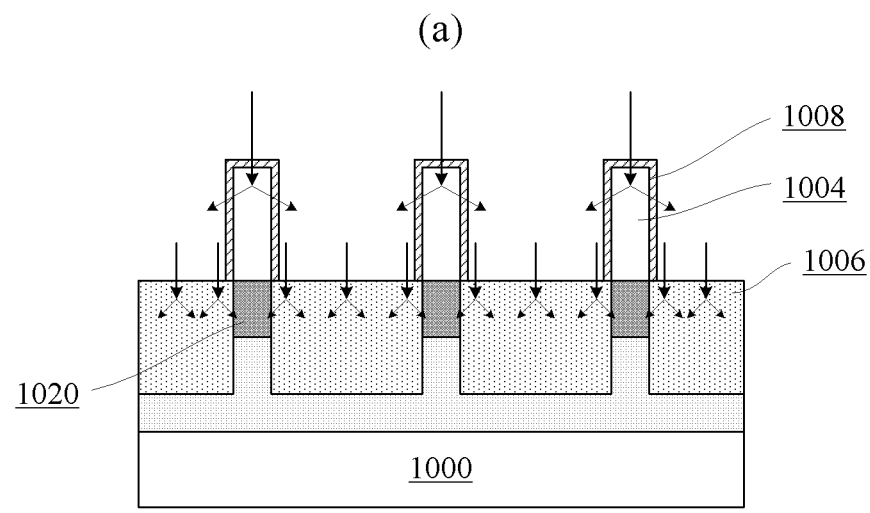
Figure 13:
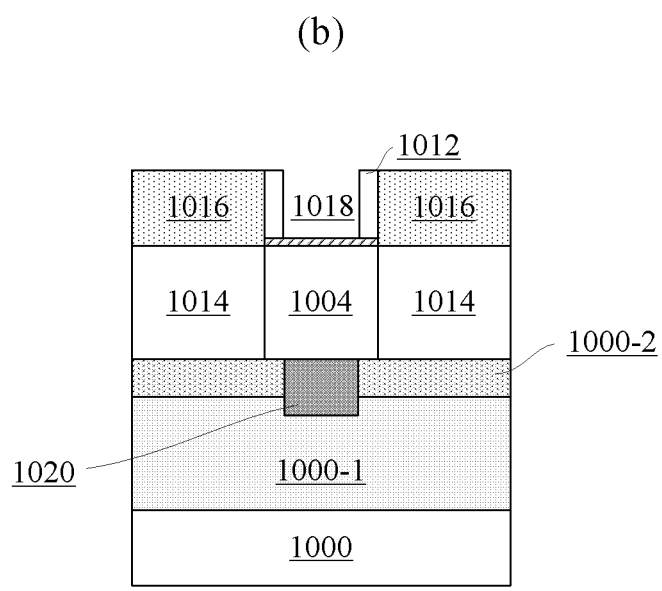

Next, as shown in FIG. 13 (FIG. 13(a) shows a cross-sectional view corresponding to that of FIG. 12(b), and FIG. 13(b) shows a cross-sectional view corresponding to that of FIG. 12(c)), a punch-through stopper (PTS) 1020 may be formed by implantation through the gate trench 1018. The PTS 1020 may have the same doping type as the well (1000-1 and 1000-2), and have a doping concentration higher than that of the well. For example, p-type impurities such as B, $BF_2$ or In may be implanted for an n-type device; and n-type impurities such as As or P may be implanted for a p-type device. The ion implantation may be carried out in a direction substantially perpendicular to the surface of the substrate. Parameters for the ion implantation may be controlled, so that the PTS may be formed in a portion of the fin structure 1004 which is located below the surface of the isolation layer 1006 and may have a desired doping concentration. It should be noted that a part of dopants (ions or elements) may be scattered from the exposed portions of the fin structures due to a form factor of the fin structures 1004. Thus, it is beneficial to form an abrupt doping distribution in a depth direction. Annealing, such as spike annealing, laser annealing, and/or rapid annealing, may be performed to activate the implanted impurities. Such a PTS may facilitate to reduce leakage between the source and the drain. As shown in FIG. 13(b), the PTS 1020 is self-aligned to the direct under of the gate trench 1018 due to the presence of the dielectric layer 1016, while there is no such a PTS formed in regions underlying the semiconductor layer 1014 where the source and drain regions are formed.

Figure 14:
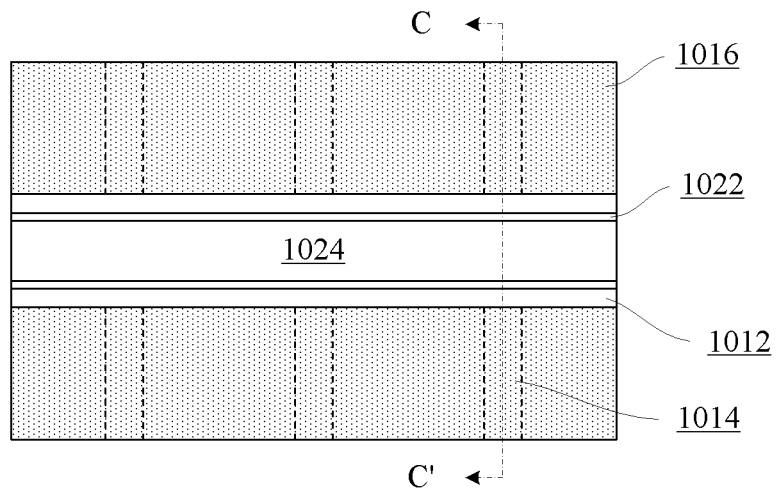
Figure 14:
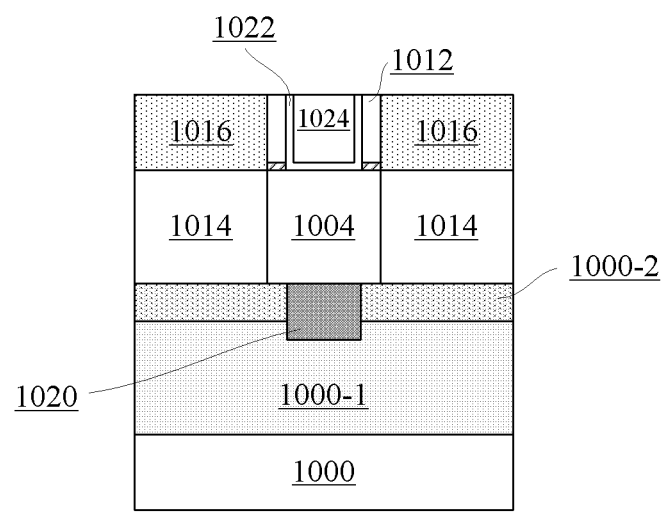

Next, as shown in FIG. 14 (FIG. 14(b) shows a cross-sectional view along line CC' of FIG. 14(a)), a gate conductor layer 1024 may be formed in the gate trench 1018, so as to form a final gate stack. Preferably, the sacrificial gate dielectric layer 1008 may be removed, and a gate dielectric layer 1022 and the gate conductor layer 1024 may be formed in sequence in the gate trench 1018. The gate dielectric layer 1022 may comprise a high-K gate dielectric, e.g. $HfO_2$, with a thickness of about 1-5 nm. The gate conductor layer 1024 may comprise a metal gate conductor. Preferably, a work function adjustment layer (not shown) may also be formed between the gate dielectric layer 1022 and the gate conductor layer 1024.

Thus, the semiconductor device according to the embodiment is achieved. As shown in FIG. 14, the semiconductor device may comprise the fin structure 1004 formed on the substrate 1000. The semiconductor device may further comprise the isolation layer 1006 formed on the substrate 1000. The isolation layer 1006 exposes a portion of the fin structure 1004, which serves as a fin for the semiconductor device. Further, the semiconductor device may comprise the gate stack (including the gate dielectric layer 1022 and the gate conductor layer 1024) formed on the isolation layer 1006 and intersecting the fin 1004. In addition, the semiconductor device may comprise the PTS self-aligned to the direct under of the channel region (corresponding to a portion of the fin 1004 where the fin intersects the gate stack).

The substrate 1000 may have the well formed therein. The well may include the section 10000-2 with the relatively low doping concentration and the section 1000-1 with the relatively high doping concentration. As shown in FIG. 14, the source/drain regions (formed in the semiconductor layer 1014) are in contact with the section 10000-2 with the relatively low doping concentration, resulting in a reduced junction capacitance therebetween. The PTS 1020 may have the same doping type as the well (1000-1 and 1000-2), and have the doping concentration greater than that of the well.

Further, in the case where the strained source/drain technology is applied, the portion of the fin structure 1004 exposed by the isolation layer 1006 (that is, the above described "fin") is positioned under the gate stack and the gate spacer, and opposite sidewalls of the fin have the semiconductor layer 1014 formed thereon where the source/drains are formed. The semiconductor layer 1014 may be formed in a fin-like shape.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

What is claimed is:

1. A semiconductor device comprising:
 a substrate having a well formed therein, the well including a first section and a second section, wherein the first section has a lower doping concentration and is closer to a surface of the substrate than the second section;
 a fin structure formed on the surface of the substrate;
 an isolation layer formed on the surface of the substrate, wherein the isolation layer exposes a portion of the fin structure, which serves as a fin for the semiconductor device;
 a gate stack formed on the isolation layer and intersecting the fin,
 wherein a Punch-Through Stopper (PTS) is formed in only a region directly under a portion of the fin where the fin intersects the gate stack, and has a profile self-aligned to the gate stack.

2. The semiconductor device according to claim 1, further comprising a semiconductor layer formed on opposite sidewalls of the fin, wherein source/drain regions are formed in the semiconductor layer.

3. The semiconductor device according to claim 2, wherein the semiconductor layer is compressive-stressed for a p-type device, or tensile-stressed for an n-type device.

4. The semiconductor device according to claim 3, wherein the substrate comprises bulk Si, the fin is integral with the substrate, and the semiconductor layer comprises SiGe or Si:C.

5. The semiconductor device according to claim 1, wherein the PTS has a doping type opposite to that of the well and has a higher doping concentration than that of the well.

6. The semiconductor device according to claim 1, wherein the doping concentration of the first section is less than about $2E18$ $cm^{-3}$, and the doping concentration of the second section is higher than about $2E18$ $cm^{-3}$.

* * * * *